US006831822B2

(12) United States Patent
Berberich et al.

(10) Patent No.: US 6,831,822 B2
(45) Date of Patent: Dec. 14, 2004

(54) INTERFERENCE SUPPRESSOR

(75) Inventors: Reinhold Berberich, Frankfurt (DE); Dieter Busch, Rosbach (DE)

(73) Assignee: Siemens Aktiengesellschaft, München (DE)

( * ) Notice: Subject to any disclaimer, the term of this patent is extended or adjusted under 35 U.S.C. 154(b) by 69 days.

(21) Appl. No.: 10/257,226

(22) PCT Filed: Mar. 7, 2001

(86) PCT No.: PCT/EP01/02559

§ 371 (c)(1),
(2), (4) Date: May 18, 2003

(87) PCT Pub. No.: WO01/82670

PCT Pub. Date: Nov. 1, 2001

(65) Prior Publication Data

US 2004/0042146 A1 Mar. 4, 2004

(30) Foreign Application Priority Data

Apr. 20, 2000 (DE) .......................... 100 19 886
Aug. 22, 2000 (DE) .......................... 100 41 286

(51) Int. Cl.$^7$ ................................ H02H 9/06
(52) U.S. Cl. .................... 361/118; 361/15; 361/56; 361/111; 361/113; 361/119; 361/124
(58) Field of Search ................ 361/118, 119, 361/120, 124, 13, 15, 22, 43, 56, 57, 111, 126, 129, 90–94

(56) References Cited

U.S. PATENT DOCUMENTS

| | | | |
|---|---|---|---|
| 4,079,343 A | 3/1978 | Nijman | |
| 4,144,509 A | 3/1979 | Boutros | |
| 4,473,755 A | 9/1984 | Imai et al. | |
| 4,668,873 A | 5/1987 | Kamiya et al. | |
| 4,866,563 A * | 9/1989 | Howard et al. | 361/124 |
| 5,414,587 A * | 5/1995 | Kiser et al. | 361/118 |
| 5,617,287 A * | 4/1997 | Allina | 361/118 |
| 5,905,627 A | 5/1999 | Brendel et al. | |
| 6,430,019 B1 * | 8/2002 | Martenson et al. | 361/124 |
| 6,678,140 B2 * | 1/2004 | Jakwani et al. | 361/118 |

FOREIGN PATENT DOCUMENTS

| | | |
|---|---|---|
| DE | 1934727 | 11/1971 |
| DE | 3326629 | 1/1985 |
| DE | 8811254 | 4/1989 |
| DE | 9107385 | 8/1992 |
| DE | 29902505 | 4/2000 |

OTHER PUBLICATIONS

Patent Abstracts of Japan vol. 018, No. 458 (E–1596), Aug. 25, 1994 & JP 06 151014 A (Mitsubishi Materials Corp), May 31, 1999.
Patent Abstracts of Japan vol. 1999, No. 05, May 31, 1999 & JP 11 044600 A (Matsushita Electric Works Ltd), Feb. 16, 1999.

* cited by examiner

*Primary Examiner*—Dean A. Reichard
*Assistant Examiner*—Nguyen T. Ha
(74) *Attorney, Agent, or Firm*—Martin A. Farber

(57) ABSTRACT

The invention relates to a suppression device for an electronic appliance having a plug-in device which has at least one plug-in element and is designed for attachment to a housing of the electronic appliance, with a capacitor having at least two capacitor plates being provided in order to improve the electromagnetic sensitivity. In a simple and low-cost suppression measure for electronic appliances, which is also suitable for mass production, the capacitor is arranged outside the housing of the electronic appliance and is electrically connected firstly to a plug-in element of the plug-in device and secondly to the potential of the electrically conductive housing.

14 Claims, No Drawings

INTERFERENCE SUPPRESSOR

DESCRIPTION

The invention relates to a suppression device for an electronic appliance having a plug-in device which has at least one plug-in element and is designed for attachment to a housing of the electronic appliance, with a capacitor being provided in order to improve the electromagnetic sensitivity.

In order to ensure correct operation of electronic devices, these devices must be shielded against interference radiation which occurs in particular in the radio-frequency band. Such suppression measures are normally carried out on a printed circuit board which is located in the interior of the electronic appliance.

DE 33 26 629 C2 discloses an interference protection filter for electronic controllers in a motor vehicle, in which the interference protection filter is arranged directly adjacent to the input of the plug connections in the housing. A capacitively acting switching element in this case has two capacitor plates, with one capacitor plate being in the form of a line which leads to the electronic circuit from that end of a connector which projects into the electronic appliance.

This has the disadvantage that this suppression device can only attenuate interference radiation, since the supply line which is connected to the suppression device still radiates power, and this has a negative effect on the electronic components.

Standard bushing capacitors which are normally used for suppression and are soldered into metal housings are expensive and complex to process.

The invention is thus based on the object of specifying a simple and low-cost suppression measure for electronic appliances which are also suitable for mass production.

According to the invention, the object is achieved in that the capacitor is arranged outside the housing of the electronic appliance and is electrically connected firstly to a plug-in element of the plug-in device and secondly to the potential of the electrically conductive housing.

The invention has the advantage that the suppression is actually provided on the outside of the electronic appliance, and interference radiation cannot enter the housing interior at all. Such a suppression device is simple to install since the insertion of the connector into the housing produces a suppression filter. There are no additional installation measures.

In order to make it possible to dispense with cables to the capacitor, a first capacitor plate is formed in or on the plug-in device.

The first capacitor plate is advantageously formed from the plug-in element itself. This can easily be achieved, for example, by upsetting the connector pin. This further simplifies the production of the connector.

Alternatively, the first capacitor plate is formed by a conductor surface which is arranged on a mounting element, is arranged alongside the plug-in element and is electrically connected to it. This is done simply by the first capacitor surface enclosing the plug-in element, which has no insulation and carries an electrical potential, in an interlocking and/or force-fitting manner. This results in a device which can be handled particularly well for mass production.

The mounting element advantageously has at least one further conductor surface, which forms the second capacitor plate and is arranged above and/or underneath the first conductor surface, electrically isolated from it. The mounting element together with the two capacitor plates can be prefabricated, so that only the electrical connection still needs to be produced during connector installation.

In a development of the invention, a conductor surface which forms the second capacitor plate is in the form of a contact coating on one surface of the mounting element. In this case, there are two possible ways to produce the electrical connection for the housing potential.

Firstly, the electrically conductive contact coating of the mounting element is located directly on the outside of the housing, resulting in a conductive connection and in the contact coating assuming the housing potential. In this arrangement, there is no need whatsoever for any additional conductive connections.

The contact coating is advantageously in the form of a conductive adhesive, so that the mounting element is at the same time attached to the housing.

In another refinement, the electrical connection between that conductor surface of the mounting element which forms the second capacitor plate and the housing is produced by means of at least one attachment element which holds the mounting element and/or the plug-in device on the housing. The housing potential is in this case produced via a screw, riveted or press-in connections, which are present in any case, at at least one point.

If the second conductor surface is in the form of a contact surface, insulation is arranged between it and the outside of the housing. In this case as well, the plug-in device is located in an unchanged manner and firmly on the housing outer wall.

In order to form a further capacitor for the same plug-in element, the mounting element has two further conductor surfaces, which are located one above the other and are electrically isolated from one another, with the third conductor surface being electrically connected to the plug-in element and the fourth conductor surface being electrically connected to the housing potential. This multilayer construction allows larger capacitance values to be achieved for each connector pin.

In one simple refinement, the plug-in device has a number of plug-in elements, with the first capacitor surfaces, which are electrically isolated from one another and are associated with different plug-in elements, being formed in a conductor coating.

The second capacitor surface is formed by the unstructured contact coating for all the plug-in elements. An arrangement such as this can easily be produced by means of film printed circuits.

In one advantageous development, the mounting element can be fitted on that side of the plug-in device which faces the housing and can be made contact with in that a first capacitor surface in each case encloses in each case one plug-in element.

A commercially available connector can thus be provided with an additional suppression device according to the invention.

The invention allows numerous embodiments. One of these will be explained in more detail with reference to the figures which are illustrated in the drawing, in which:

FIG. 1: shows a section through a controller

FIG. 2: shows a first embodiment of the suppression board

FIG. 3: shows a second embodiment of the suppression board

FIG. 4: shows a third embodiment of the suppression board.

Identical features are identified by the same reference symbols.

FIG. 1 shows an electrical appliance as is normally used in motor vehicles. This may be a controller for a motor vehicle, which has signal-processing electronics which, as is known, are highly susceptible to interference at radio frequencies. However, it is also feasible for the electronic appliance to be a sensor device which, in addition to an actual sensor, has a signal processing circuit and/or a signal evaluation circuit, which are/is arranged on one or more printed circuit boards.

The electronic appliance has a cup-shaped housing part 1 which is composed of aluminum and is sealed by a cover 2.

The cup-shaped housing part 1 has a connector body 3, which is attached on the outside to the housing part 1 by means of screws or rivets 4. The connector pins 5 of the connector body 3 project not only into the connector body 3 but also into the housing interior 6. The connector 3 connects the appliance circuits via the connector pins 5 to other electronic devices in the motor vehicle.

At least one printed circuit board 7 is arranged in the housing interior 6 and is populated with components 8 which provide electronic circuits. The connector pins 5 which project into the housing interior 6 are electrically connected to the components 8 that are located on the printed circuit board 7, in order to supply signals and electrical power.

A suppression board 9 is inserted between the connector 3 on the outside of the housing part 1, and is attached to the housing part 1 together with the connector 3.

FIGS. 2–4 explain various embodiments of the suppression board 9 in more detail.

FIG. 2 shows a suppression board 9 with openings 13 for the connector pins 5. In addition to these openings 13, a discrete capacitor 10 is provided for each connector pin 5 and is connected by means of wiring that is arranged on the board 9, such that each capacitor 10 is connected firstly to the connector pin potential and secondly to the potential of the housing 1. In this case, the housing potential is normally ground.

The prefabricated board 9 is pushed over the connector pins 5, with a circumferential connector seal 12 enclosing the suppression board 9 at its edge, and sealing it at the same time. The suppression board 9 is attached to the outer skin of the housing part 1 by means of screws 4 which engage in the openings 11 in the suppression board 9 and in the openings 14 in the connector body 3. It is attached such that the seal 12 rests on the housing part 1. The screws 4 at the same time electrically connect the capacitors 10 to the housing potential.

Another embodiment, in which capacitances are integrated in the suppression board 9, is shown in FIG. 3. The suppression board 9 is in the form of a board without any components, for example a film printed circuit, and has a structured conductor coating 15. The structure corresponds to individual capacitor surfaces 16 which are isolated from one another. In this case, a capacitor surface 16 is provided for each connector pin 5 and encloses the opening 13 of the respective connector pin 5. These openings 13 are metalized, with each capacitor surface 16 being connected to the metalized opening 13 at the boundary surface, thus producing an electrical connection. After insertion of the connector pins 5, the capacitor surfaces 16 are at the connector potential. In this embodiment, push-processes are particularly advantageous as electrical connection mechanisms for making contact, where the plug-in elements 5 are made contact with by pushing them into the suppression board 9. If the plug-in element 5 has two push-in zones, which are not shown in any more detail, the pushing-in process makes contact both with the suppression board 9 and with the printed circuit board 7.

The filter plate 9 has a further conductive coating 18 on the surface facing the housing, and this further conductive coating 18 rests directly on the housing 1 once the connector 3 has been fitted. It thus assumes the housing potential, with the conductive housing 1 forming the second capacitor plate. The unstructured conductive surface 18 is preferably in the form of conductive adhesive, in order to attach the suppression board 9 to the housing.

This refinement results in each connector pin 5 itself acting as a capacitor plate and, together with the housing part 1 that is connected to ground, forming a suppression capacitor.

FIG. 4 shows a further embodiment. The suppression board 9 is in the form of multilayer [lacuna] formed from conductor surface coatings which are pressed to one another and have fabric-reinforced synthetic resin coatings located in between (FR4 base material). According to this embodiment, the filter board 9 is provided with four copper layers 19, 20, 21, 22. One copper layer 19 and 22 is arranged on each of the two outer faces of the board 9. Two further copper layers 20, 21 are located within the suppression board 9, isolated from one another, and form the capacitor surfaces 16, as has been described in conjunction with FIG. 3.

The two outer copper layers 19, 22 are connected to the housing potential via the attachment elements 4 and are electrically isolated from the potential carried by the connector pin 5. These copper layers 19, 22 are connected via a number of through-plated contacts, which are not shown in any more detail but are arranged such that they enclose the capacitor surfaces 16, thus providing shielding. The capacitor surfaces 16 are electrically connected to the connector pins 5 in the manner already described. Two capacitors are thus provided for each connector pin. If even more capacitors are required, then this can easily be produced by means of further alternate installation of copper layers 20, 21, which form the structured capacitor surfaces 16, and unstructured copper layers 19, 22, which are formed over the entire surface and are at the housing potential.

If necessary, a large number of such mutually isolated conductor surfaces 19, 20, 21, 22 can be arranged within the suppression board.

In addition to the explained embodiment, the capacitor surfaces 16 may also be formed using stamped parts or Kapton films, which are embedded in an insulating material. At the same time, this may carry out sealing tasks, depending on the material or material combination used to sheath the capacitor plates.

These capacitor surfaces according to the invention form capacitances in the range up to 100 pF with the outer housing. In addition to a direct electrical connection between the capacitor and the plug-in element 5 or the electrically conductive housing 1, it is, however, also sufficient to improve the electromagnetic sensitivity, for there to be one capacitive coupling. The critical feature is that the suppression board 9 which forms the capacitor is itself not surrounded by an electrically conductive housing. The suppression board 9 is in this case advantageously integrated in a plastic appliance connector, or is surrounded by such a connector.

What is claimed is:

1. A suppression device for an electronic appliance having a plug-in device which has at least one plug-in element and is designed for attachment to a housing of the electronic appliance, the suppression device comprising a capacitor provided to improve electromagnetic sensitivity, wherein the housing is an lectrically conductive housing (1, 2) and wherein the capacitor (10) is arranged outside the housing (1, 2) of the electronic appliance and is electrically connected firstly to the plug-in element (5) of the plug-in device (3) and secondly to potential of the electrically conductive housing (1, 2).

2. The suppression device am claimed in claim 1, wherein a first capacitor plate (16) of the capacitor (10) is arranged in or on the plug-in device (3).

3. The suppression device as claimed in claim 2, wherein the first capacitor plate (16) in formed from the plug-in element (5) itself.

4. The suppression device as claimed in claim 2, wherein the first capacitor plate (16) is formed by a first conductor surface (15) arranged on a mounting element (9), is arranged alongside the plug-in element (5) and is electrically connected thereto.

5. The suppression device as claimed in claim 4, wherein the first conductor surface (15) is a first capacitor surface, and the mounting element (9) has at least one second conductor surface (18), which forms a second capacitor surface and is arranged above and/or underneath the first conductor surface (15), electrically isolated therefrom.

6. The suppression device as claimed in claim 5, wherein the electrical connection between the second conductor surface (18) of the mounting element (9) and the housing (1, 2) is produced by at least one attachment element (4) which holds the mounting element (9) and/or the plug-in device (3) on the housing (1, 2).

7. The suppression device as claimed in claim 5, wherein the second conductor surface (18) forms a second capacitor plate and is in form of a contact coating on a surface of the mounting element (9).

8. The suppression device as claimed in claim 7, wherein insulation (17) is arranged between the contact coating (18) and an outside of the housing (1, 2).

9. The suppression device as claimed in claim 7, wherein the contact coating (18) of the mounting element (9) is located directly on the outside of the housing (1, 2).

10. The suppression device as claimed in claim 9, wherein the contact coating (18) is in the form of conductive adhesive.

11. The suppression device as claimed in claim 5, wherein the mounting element (9) has two further conductor surfaces (19, 20; 21, 22) comprising a third and fourth conductor surface, which are located one above the other and are electrically isolated from one another, in order to form a further capacitor for same said plug-in element (5), with the third conductor surface (20, 21) being electrically connected to the plug-in element (5) and the fourth conductor surface (19, 22) being electrically connected to the housing potential.

12. The suppression device as claimed in claim 11, wherein the plug-in device (3) has a number of plug-in elements (5), with the first capacitor surfaces (16), which are electrically isolated from one another and are associated with different of said plug-in elements (5), being formed in a conductor coating (15).

13. The suppression device as claimed in claim 11, wherein the second capacitor surface is formed by an unstructured contact coating (18) for all the plug-in elements (5).

14. The suppression device as claimed in claim 12, wherein the mounting clement (9) is fitable on a side of the plug-in device (3) which faces the housing (1, 2) and is made contactable with in that the first capacitor surface (16) in each case encloses in each case one said plug-in element (5).

* * * * *